US012696737B2

(12) United States Patent　　(10) Patent No.: US 12,696,737 B2

Ghosh et al.　　(45) Date of Patent: Jul. 28, 2026

(54) COMPRESSIVE FILMS FOR LARGE AREA GAPFILL

(71) Applicant: Applied Materials, Inc., Santa Clara, CA (US)

(72) Inventors: Supriya Ghosh, San Jose, CA (US); Zeqing Shen, San Jose, CA (US); Susmit Singha Roy, Sunnyvale, CA (US); Abhijit Basu Mallick, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 504 days.

(21) Appl. No.: 18/192,549

(22) Filed: Mar. 29, 2023

(65) Prior Publication Data

US 2024/0332028 A1　　Oct. 3, 2024

(51) Int. Cl.
| | |
|---|---|
| *H01L 21/3105* | (2006.01) |
| *H01J 37/32* | (2006.01) |
| *H10P 14/60* | (2026.01) |
| *H10P 14/692* | (2026.01) |
| *H10P 95/00* | (2026.01) |

(52) U.S. Cl.
CPC ........ *H10P 95/06* (2026.01); *H01J 37/32816* (2013.01); *H10P 14/6334* (2026.01); *H10P 14/69215* (2026.01); *H01J 2237/336* (2013.01)

(58) Field of Classification Search
CPC ......... H01L 21/31051; H01L 21/02164; H01L 21/02271; H01J 37/32816; H01J 2237/336; H10P 95/06; H10P 14/6334; H10P 14/69215
See application file for complete search history.

(56) References Cited

U.S. PATENT DOCUMENTS

| | | | | |
|---|---|---|---|---|
| 10,354,860 | B2 * | 7/2019 | Li | .......................... H10B 43/00 |
| 2011/0165347 | A1 | 7/2011 | Miller et al. | |
| 2014/0213070 | A1 | 7/2014 | Hong et al. | |
| 2018/0305812 | A1 | 10/2018 | Fox et al. | |

(Continued)

FOREIGN PATENT DOCUMENTS

| | | |
|---|---|---|
| KR | 20160093551 A | 8/2016 |
| KR | 20190088069 A | 7/2019 |
| KR | 20190095142 A | 8/2019 |

OTHER PUBLICATIONS

International Search Report and Written Opinion for PCT/US2024/020359 mailed Jul. 1, 2024, 10 pages.

(Continued)

*Primary Examiner* — Victor A Mandala
*Assistant Examiner* — Colleen E Snow
(74) *Attorney, Agent, or Firm* — Kilpatrick Townsend & Stockton LLP

(57) ABSTRACT

Exemplary methods of semiconductor processing may include providing a silicon-containing precursor to a processing region of a semiconductor processing chamber. A substrate may be disposed within the semiconductor processing chamber. The methods may include forming a silicon-containing material on the substrate. The silicon-containing material may be characterized by a stress of greater than or about −200 MPa. The methods may include annealing the substrate at a temperature of greater than or about 700° C.

19 Claims, 3 Drawing Sheets

(56)        References Cited

U.S. PATENT DOCUMENTS

2019/0304775  A1    10/2019  Li et al.
2021/0134592  A1     5/2021  Mutyala et al.

OTHER PUBLICATIONS

International Application No. PCT/US2024/020359, International
Preliminary Report on Patentability mailed on Oct. 9, 2025, 7 pages.
Korean Application No. 10-2025-7033937, Office Action mailed on
Apr. 7, 2026, 18 pages (9 pages of original document and 9 pages
of English Translation).

\* cited by examiner

200

COMPRESSIVE FILMS FOR LARGE AREA GAPFILL

TECHNICAL FIELD

The present technology relates to methods and components for semiconductor processing. More specifically, the present technology relates to systems and methods for depositing silicon-containing materials with increased compressive stress.

BACKGROUND

Integrated circuits are made possible by processes which produce intricately patterned material layers on substrate surfaces. Producing patterned material on a substrate requires controlled methods for forming and removing material. As device sizes continue to reduce, features within the integrated circuits may get smaller and aspect ratios of structures may grow, and maintaining dimensions of these structures during processing operations may be challenged. Some processing may result in films that may not be able to withstand further processing. Developing materials that can withstand further processing after deposition may become more difficult as device sizes continue to scale.

Thus, there is a need for improved systems and methods that can be used to produce high quality devices and structures. These and other needs are addressed by the present technology.

SUMMARY

Exemplary methods of semiconductor processing may include providing a silicon-containing precursor to a processing region of a semiconductor processing chamber. A substrate may be disposed within the semiconductor processing chamber. The methods may include forming a silicon-containing material on the substrate. The silicon-containing material may be characterized by a stress of greater than or about −200 MPa. The methods may include annealing the substrate at a temperature of greater than or about 700° C.

In some embodiments, the silicon-containing precursor may be or include silane ($SiH_4$), disilane ($Si_2H_6$), or trisilane ($Si_3H_8$). A temperature within the semiconductor processing chamber may be maintained at less than or about 600° C. while forming the silicon-containing material. A pressure within the semiconductor processing chamber may be maintained at less than or about 350 T. The methods may include providing an oxygen-containing precursor with the silicon-containing precursor. The semiconductor processing chamber may be maintained plasma-free while forming the silicon-containing material. Subsequent to annealing the silicon-containing material, the silicon-containing material may be characterized by a shrinkage of less than or about 5%. The methods may include, subsequent to forming the silicon-containing material, providing an inert precursor to the processing region of the semiconductor processing chamber, forming plasma effluents of the inert precursor, and contacting the silicon-containing material with the plasma effluents of the inert precursor. The inert precursor may be or include argon. The methods may include providing an oxygen-containing precursor with the inert precursor.

Some embodiments of the present technology may include semiconductor processing methods. The methods may include providing a silicon-containing precursor to a processing region of a semiconductor processing chamber. A substrate may be disposed within the semiconductor processing chamber. The silicon-containing precursor may be or include disilane ($Si_2H_6$). The methods may include forming a silicon-containing material on the substrate. The silicon-containing material may be characterized by a stress of greater than or about −200 MPa. The methods may include annealing the substrate at a temperature of greater than or about 700° C. The silicon-containing material may be characterized by a shrinkage of less than or about 5%.

In some embodiments, the substrate may include one or more features. The silicon-containing material may be characterized by a breakdown of greater than or about 5 MV/cm. Annealing the substrate may include contacting the substrate with a nitrogen-containing precursor. The methods may include performing a plasma treatment with an inert precursor subsequent to forming the silicon-containing material. The plasma treatment may be performed at a lower pressure than the forming of the silicon-containing material. The inert precursor may be or include argon.

Some embodiments of the present technology may include semiconductor processing methods. The methods may include providing a silicon-containing precursor and an oxygen-containing precursor to a processing region of a semiconductor processing chamber. A substrate may be disposed within the semiconductor processing chamber. The methods may include forming a silicon-containing material on the substrate. The silicon-containing material may be characterized by a stress of greater than or about −200 MPa. The methods may include providing an inert precursor to the processing region of the semiconductor processing chamber. The methods may include forming plasma effluents of the inert precursor. The methods may include contacting the silicon-containing material with the plasma effluents of the inert precursor. The methods may include annealing the substrate.

In some embodiments, the silicon-containing material may be characterized by a shrinkage of less than or about 5%. A thickness of the silicon-containing material may be less than or about 30 Å.

Such technology may provide numerous benefits over conventional systems and techniques. For example, embodiments of the present technology may deposit silicon-containing films characterized by high compressive stress. Additionally, the present technology may produce silicon-containing films that, for example, after an anneal, may be characterized by reduced shrinkage. These characteristics may provide films for gapfilling applications, as well as any other application for which deposited films characterized by high compressive stress and/or reduced shrinkage may be a benefit. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
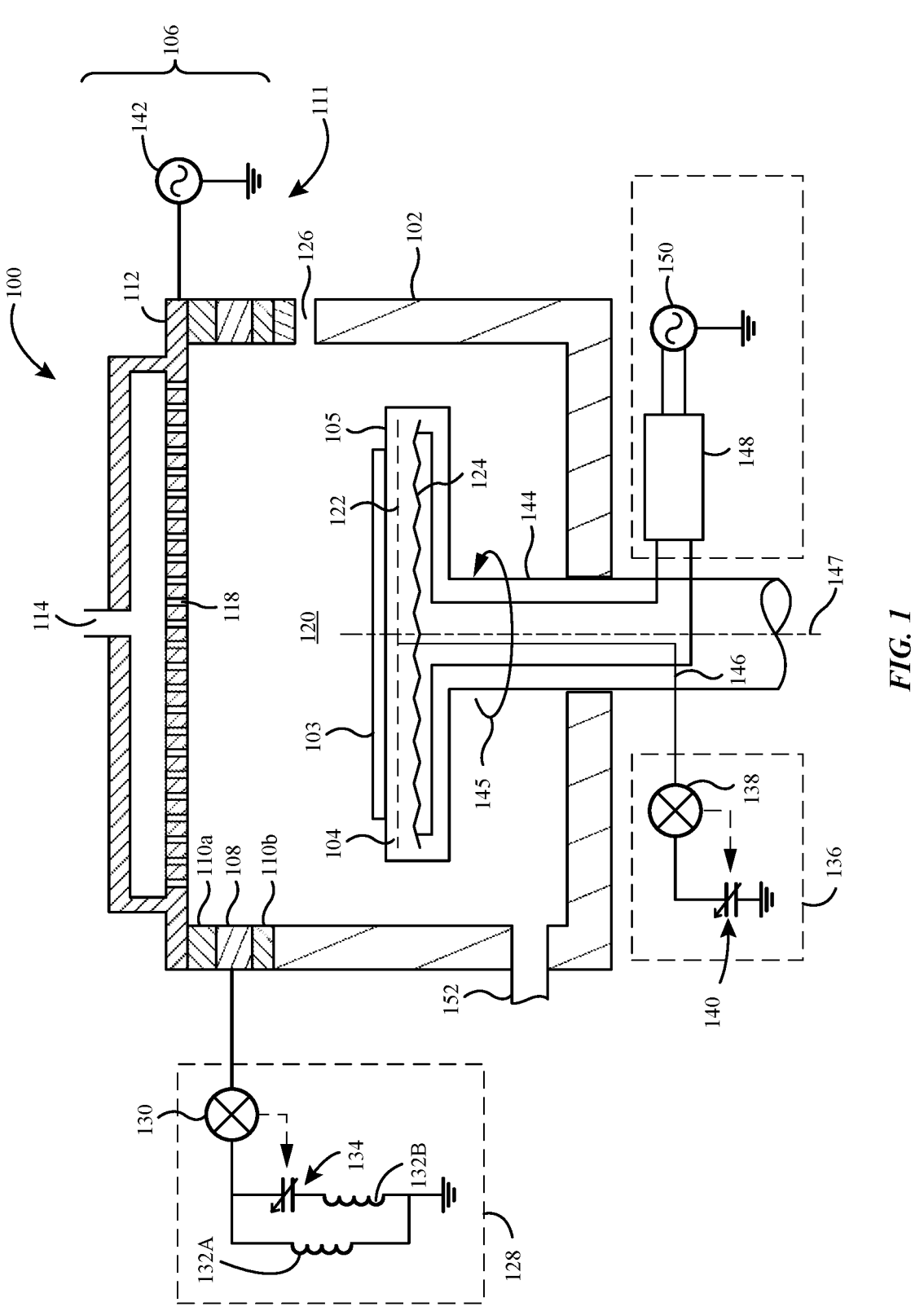
FIG. 1 shows a schematic cross-sectional view of an exemplary plasma system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

As device sizes continue to shrink, many material layers may be reduced in thickness and size to scale devices. Features across semiconductor structures may be reduced in size, and aspect ratios of the features may increase. As the aspect ratios of the features increase, deposition processes may produce films that may not be able to withstand further processing operations, such as anneals.

Conventional technologies, such as operations associated with 3D NAND, have struggled to produce compressive films, such as silicon-containing films, for large gapfill applications. Deposition of silicon-containing material on 3D NAND structures may result in a tensile film prone to cracking during further processing, including during anneal operations. Conventional precursors used in 3D NAND large gapfill applications include tetraethyl orthosilicate (TEOS) and ozone ($O_3$), which may form a film that is tensile by nature. These tensile silicon-containing films may be prone to cracking and/or shrinkage during anneal operations, such as anneal operations to form memory cells in the 3D NAND structure. Accordingly, many conventional technologies have been limited in the ability to prevent structural flaws in the final devices.

The present technology overcomes these issues by forming a film with specific precursors selected to increase a compressive stress of the film. By utilizing specific precursors, a film that is compressive in nature may be formed, as opposed to a film that is tensile. Additionally, the present technology may perform a film treatment to further enhance properties of the film. The treatment may be a plasma-enhanced treatment reorganizes bonds in the film. By reorganizing bonds in the film, the compressive stress may be further increased. The film treatment may also result in a reduced shrinkage of the film during further processing, such as an anneal, to, for example, form memory cells in 3D NAND. By depositing a silicon-containing material with an increased compressive stress and/or reduced shrinkage, the present technology may prevent problems in any following integration processes and/or defects in the final devices, such as cracking of the silicon-containing material.

Although the remaining disclosure will routinely identify specific deposition processes utilizing the disclosed technology, and will describe one type of semiconductor processing chamber, it will be readily understood that the processes described may be performed in any number of semiconductor processing chambers. Accordingly, the technology should not be considered to be so limited as for use with these specific deposition processes or chambers alone. The disclosure will discuss one possible chamber that may be used to perform processes according to embodiments of the present technology before methods of semiconductor processing according to the present technology are described.

FIG. 1 shows a cross-sectional view of an exemplary semiconductor processing chamber 100 according to some embodiments of the present technology. The figure may illustrate an overview of a system incorporating one or more aspects of the present technology, and/or which may be specifically configured to perform one or more operations according to embodiments of the present technology. Additional details of chamber 100 or methods performed may be described further below. Chamber 100 may be utilized to form film layers according to some embodiments of the present technology, although it is to be understood that the methods may similarly be performed in any chamber within which film formation may occur. The semiconductor processing chamber 100 may include a chamber body 102, a substrate support 104 disposed inside the chamber body 102, and a lid assembly 106 coupled with the chamber body 102 and enclosing the substrate support 104 in a processing volume 120. A substrate 103 may be provided to the processing volume 120 through an opening 126, which may be conventionally sealed for processing using a slit valve or door. The substrate 103 may be seated on a surface 105 of the substrate support 104 during processing. The substrate support 104 may be rotatable, as indicated by the arrow 145, along an axis 147, where a shaft 144 of the substrate support 104 may be located. Alternatively, the substrate support 104 may be lifted up to rotate as necessary during a deposition process.

A plasma profile modulator 111 may be disposed in the semiconductor processing chamber 100 to control plasma distribution across the substrate 103 disposed on the substrate support 104. The plasma profile modulator 111 may include a first electrode 108 that may be disposed adjacent to the chamber body 102, and may separate the chamber body 102 from other components of the lid assembly 106. The first electrode 108 may be part of the lid assembly 106, or may be a separate sidewall electrode. The first electrode 108 may be an annular or ring-like member, and may be a ring electrode. The first electrode 108 may be a continuous loop around a circumference of the semiconductor processing chamber 100 surrounding the processing volume 120, or may be discontinuous at selected locations if desired. The first electrode 108 may also be a perforated electrode, such as a perforated ring or a mesh electrode, or may be a plate electrode, such as, for example, a secondary gas distributor.

One or more isolators 110a, 110b, which may be a dielectric material such as a ceramic or metal oxide, for example aluminum oxide and/or aluminum nitride, may contact the first electrode 108 and separate the first electrode 108 electrically and thermally from a gas distributor 112 and from the chamber body 102. The gas distributor 112 may define apertures 118 for distributing process precursors into the processing volume 120. The gas distributor 112 may be coupled with a first source of electric power 142, such as an RF generator, RF power source, DC power source, pulsed DC power source, pulsed RF power source, or any other power source that may be coupled with the semiconductor processing chamber 100. In some embodiments, the first source of electric power 142 may be an RF power source.

The gas distributor 112 may be a conductive gas distributor or a non-conductive gas distributor. The gas distributor 112 may also be formed of conductive and non-conductive components. For example, a body of the gas distributor 112 may be conductive while a face plate of the gas distributor 112 may be non-conductive. The gas distributor 112 may be powered, such as by the first source of electric power 142 as shown in FIG. 1, or the gas distributor 112 may be coupled with ground in some embodiments.

The first electrode 108 may be coupled with a first tuning circuit 128 that may control a ground pathway of the semiconductor processing chamber 100. The first tuning circuit 128 may include a first electronic sensor 130 and a first electronic controller 134. The first electronic controller 134 may be or include a variable capacitor or other circuit elements. The first tuning circuit 128 may be or include one or more inductors 132. The first tuning circuit 128 may be any circuit that enables variable or controllable impedance under the plasma conditions present in the processing volume 120 during processing. In some embodiments as illustrated, the first tuning circuit 128 may include a first circuit leg and a second circuit leg coupled in parallel between ground and the first electronic sensor 130. The first circuit leg may include a first inductor 132A. The second circuit leg may include a second inductor 132B coupled in series with the first electronic controller 134. The second inductor 132B may be disposed between the first electronic controller 134 and a node connecting both the first and second circuit legs to the first electronic sensor 130. The first electronic sensor 130 may be a voltage or current sensor and may be coupled with the first electronic controller 134, which may afford a degree of closed-loop control of plasma conditions inside the processing volume 120.

A second electrode 122 may be coupled with the substrate support 104. The second electrode 122 may be embedded within the substrate support 104 or coupled with the surface 105 of the substrate support 104. The second electrode 122 may be a plate, a perforated plate, a mesh, a wire screen, or any other distributed arrangement of conductive elements. The second electrode 122 may be a tuning electrode, and may be coupled with a second tuning circuit 136 by a conduit 146, for example a cable having a selected resistance, such as 50 ohms, for example, disposed in the shaft 144 of the substrate support 104. The second tuning circuit 136 may have a second electronic sensor 138 and a second electronic controller 140, which may be a second variable capacitor. The second electronic sensor 138 may be a voltage or current sensor, and may be coupled with the second electronic controller 140 to provide further control over plasma conditions in the processing volume 120.

A third electrode 124, which may be a bias electrode and/or an electrostatic chucking electrode, may be coupled with the substrate support 104. The third electrode may be coupled with a second source of electric power 150 through a filter 148, which may be an impedance matching circuit. The second source of electric power 150 may be DC power, pulsed DC power, RF bias power, a pulsed RF source or bias power, or a combination of these or other power sources. In some embodiments, the second source of electric power 150 may be an RF bias power. The substrate support 104 may also include one or more heating elements configured to heat the substrate to a processing temperature, which may be between about 25° C. and about 800° C. or greater.

The lid assembly 106 and substrate support 104 of FIG. 1 may be used with any processing chamber for plasma or thermal processing. In operation, the semiconductor processing chamber 100 may afford real-time control of plasma conditions in the processing volume 120. The substrate 103 may be disposed on the substrate support 104, and process gases may be flowed through the lid assembly 106 using an inlet 114 according to any desired flow plan. Gases may exit the semiconductor processing chamber 100 through an outlet 152. Electric power may be coupled with the gas distributor 112 to establish a plasma in the processing volume 120. The substrate may be subjected to an electrical bias using the third electrode 124 in some embodiments.

Upon energizing a plasma in the processing volume 120, a potential difference may be established between the plasma and the first electrode 108. A potential difference may also be established between the plasma and the second electrode 122. The electronic controllers 134, 140 may then be used to adjust the flow properties of the ground paths represented by the two tuning circuits 128 and 136. A set point may be delivered to the first tuning circuit 128 and the second tuning circuit 136 to provide independent control of deposition rate and of plasma density uniformity from center to edge. In embodiments where the electronic controllers may both be variable capacitors, the electronic sensors may adjust the variable capacitors to maximize deposition rate and minimize thickness non-uniformity independently.

Each of the tuning circuits 128, 136 may have a variable impedance that may be adjusted using the respective electronic controllers 134, 140. Where the electronic controllers 134, 140 are variable capacitors, the capacitance range of each of the variable capacitors, and the inductances of the first inductor 132A and the second inductor 132B, may be chosen to provide an impedance range. This range may depend on the frequency and voltage characteristics of the plasma, which may have a minimum in the capacitance range of each variable capacitor. Hence, when the capacitance of the first electronic controller 134 is at a minimum or maximum, impedance of the first tuning circuit 128 may be high, resulting in a plasma shape that has a minimum aerial or lateral coverage over the substrate support 104. When the capacitance of the first electronic controller 134 approaches a value that minimizes the impedance of the first tuning circuit 128, the aerial coverage of the plasma may grow to a maximum, effectively covering the entire working area of the substrate support 104. As the capacitance of the first electronic controller 134 deviates from the minimum impedance setting, the plasma shape may shrink from the chamber walls and aerial coverage of the substrate support 104 may decline. The second electronic controller 140 may have a similar effect, increasing and decreasing aerial coverage of the plasma over the substrate support 104 as the capacitance of the second electronic controller 140 may be changed.

The electronic sensors 130, 138 may be used to tune the respective circuits 128, 136 in a closed loop. A set point for current or voltage, depending on the type of sensor used, may be installed in each sensor, and the sensor may be provided with control software that determines an adjustment to each respective electronic controller 134, 140 to minimize deviation from the set point. Consequently, a plasma shape may be selected and dynamically controlled during processing. It is to be understood that, while the foregoing discussion is based on electronic controllers 134, 140, which may be variable capacitors, any electronic component with adjustable characteristic may be used to provide tuning circuits 128 and 136 with adjustable impedance.

Figure 2:
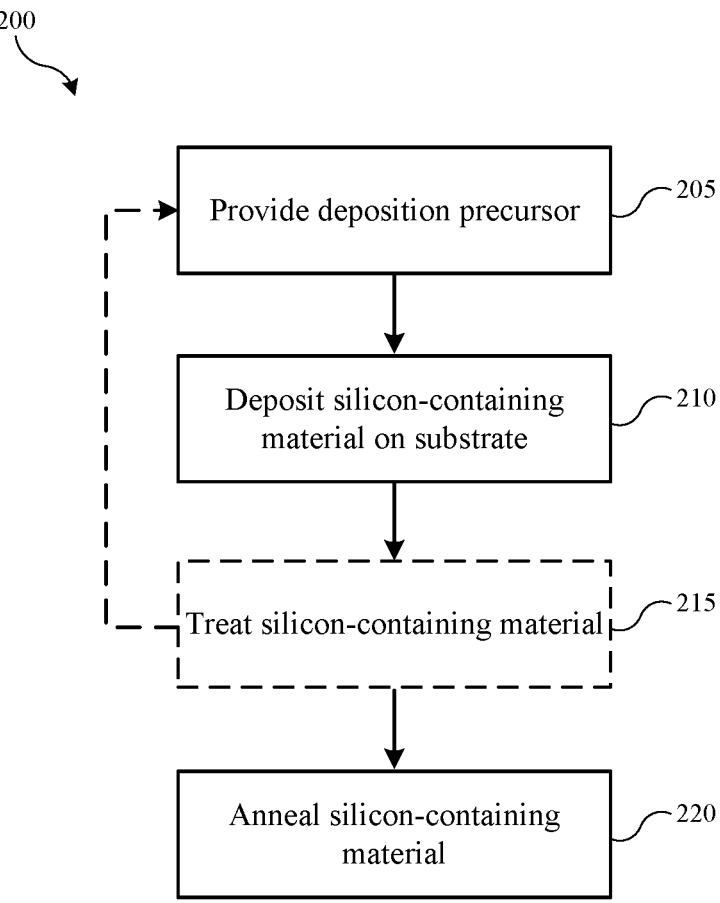
FIG. 2 shows operations in a semiconductor processing method according to some embodiments of the present technology.

FIG. 2 shows exemplary operations in a processing method 200 according to some embodiments of the present technology. The method 200 may be performed in a variety of processing chambers, including the semiconductor processing chamber 100 described above, as well as any other chambers including non-plasma chambers, in which the operations may be performed. Method 200 may include one or more operations prior to the initiation of the method 200, including front-end processing, deposition, etching, polishing, cleaning, or any other operations that may be performed prior to the described operations. The methods 200 may include a number of optional operations, which may or may not be specifically associated with some embodiments of methods according to embodiments of the present technology. For example, many of the operations are described in order to provide a broader scope of the processes performed, but are not critical to the technology, or may be performed by alternative methodology as will be discussed further below. Method 200 may describe operations shown schematically in FIGS. 3A-3D the illustrations of which will be described in conjunction with the operations of method 200. It is to be understood that the figures illustrate only partial schematic views, and a substrate may contain any number of additional materials and features having a variety of characteristics and aspects as illustrated in the figures.

Figure 3A:
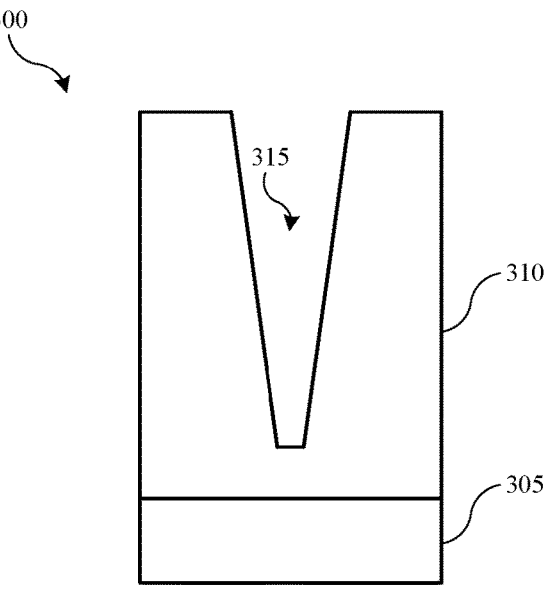
FIGS. 3A-3D show exemplary schematic cross-sectional structures in which material layers are included and produced according to some embodiments of the present technology.

Method 200 may or may not involve optional operations to develop the semiconductor structure to a particular fabrication operation. It is to be understood that method 200 may be performed on any number of semiconductor structures or substrates 305, as illustrated in FIG. 3A, including exemplary structure 300 on which one or more silicon-containing materials may be formed. As illustrated in FIG. 3A substrate 305 may be processed to form one or more features 315, which may be recessed, such as trenches, apertures, or any other structure in semiconductor processing. Substrate 305 may be any number of materials, such as a base wafer or substrate 305 made of silicon or silicon-containing materials, other substrate 305 materials, as well as one or more materials that may be formed overlying the substrate 305 during semiconductor processing. For example, in some embodiments the substrate 305 may be processed to include one or more materials or structures for semiconductor processing. Substrate 305 may be or include a dielectric material, such as an oxide or nitride of any number of materials. In embodiments, one or more layers of material 310 may be deposited on the substrate 305. In embodiments, the one or more layers of material 310 may be or include one or more materials for 3D NAND, such as oxide and/or metal materials.

As shown, one or more features 315 may be defined by the one or more layers of material 310 and/or substrate 305, such as a trench, aperture, or other recessed feature. In embodiments and as shown in FIG. 3A, the features 315 may be characterized by tapered sidewalls. In embodiments, the features 315 may be characterized by a larger diameter or width at the top of the features 315 than at the bottom of the features 315. The aspect ratio of the features 315, or the ratio of the depth of the feature relative to the width or diameter of the feature formed, may be greater than or about 1:1, and may be greater than or about 2:1, than or about 3:1, greater than or about 4:1, greater than or about 5:1, greater than or about 6:1, greater than or about 7:1, greater than or about 8:1, greater than or about 9:1, greater than or about 10:1, or more. Although only one feature 315 is shown in the figure, it is to be understood that exemplary structures may have any number of features 315 defined along the structure according to embodiments of the present technology.

At operation 205, the method 200 may include providing deposition precursors precursor to the processing region of the semiconductor processing chamber. The deposition precursors may be provided to the same processing region of the semiconductor processing chamber to perform operations prior to the initiation of the method 200. The deposition precursors may include a silicon-containing precursor, an oxygen-containing precursor, and any other useful precursors for forming a silicon-containing material.

Silicon-containing precursors that may be used in method 200 may be or include any number of silicon-containing precursors. For example, the silicon-containing precursor may be or include silane ($SiH_4$), dislane ($Si_2H_6$), trisilane ($Si_3H_8$), silicon tetrachloride ($SiCl_4$), tetraethyl orthosilicate (TEOS), or any other precursor able to form a silicon-containing film such as, for example, a silicon oxide (SiO). Although higher-order silanes may be used in embodiments of the present technology, and which may produce increased flowing of the deposited material, the increased hydrogen content in the material as deposited may lead to outgassing in subsequent operations. Oxygen-containing precursors that may be used in method 200 may be or include any number of oxygen-containing precursors. For example, the oxygen-containing precursor may be or include nitric oxide (NO), nitrous oxide ($N_2O$), diatomic oxygen ($O_2$), or any other precursor able to form a silicon-and-oxygen-containing film such as, for example, a silicon oxide (SiO). In some embodiments, along with the silicon-containing precursor and/or oxygen-containing precursor, one or more additional precursors may be delivered, such as one or more carrier or inert gases, such as argon or helium, for example.

During operation 205, a flow rate of the silicon-containing precursor may be maintained at a flow rate of less than or about 500 sccm. At greater flow rates, the deposition rate may increase and result in reduced conformality. Accordingly, a flow rate of the silicon-containing precursor may be maintained at a flow rate of less than or about 400 sccm, less than or about 300 sccm, less than or about 200 sccm, less than or about 100 sccm, less than or about 75 sccm, less than or about 50 sccm, less than or about 25 sccm, or less. Additionally, a flow rate of the oxygen-containing precursor, if present, may be maintained at greater than or about 500 sccm, such as greater than or about 750 sccm, greater than or about 1,000 sccm, greater than or about 1,250 sccm, greater than or about 1,500 sccm, greater than or about 1,750 sccm, greater than or about 2,000 sccm, greater than or about 2,250 sccm, greater than or about 2,500 sccm, greater than or about 2,750 sccm, greater than or about 3,000 sccm, greater than or about 3,250 sccm, greater than or about 3,500 sccm, greater than or about 3,750 sccm, greater than or about 4,000 sccm, greater than or about 4,250 sccm, greater than or about 4,500 sccm, greater than or about 4,750 sccm, greater than or about 5,000 sccm, or more.

Figure 3B:
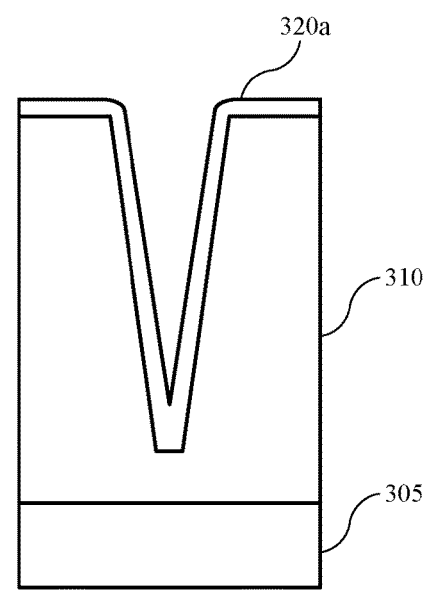

At operation 210 and as shown in FIG. 3B, the method 200 may include depositing a silicon-containing material 320a on the substrate 305 and the one or more layers of material 310 if present. The deposition precursors may contact the substrate 305 and the one or more layers of material 310 if present. As illustrated in FIG. 3B, the silicon-containing material 320a may extend along any and/or all exposed surfaces along the substrate 305, when exposed, as well as any other incorporated materials, such as the one or more layers of material 310. During operation 225, growth may occur inward within the feature 315 from the sidewalls defining the feature 315.

Depositing the silicon-containing material 320a on the substrate 305 at operation 215 may be performed as a plasma-free operation. By performing operation 215 plasma-free, the deposition of the silicon-containing material 320a may be highly conformal. In embodiments, the deposition of the silicon-containing material 320a may be characterized by a conformality of greater than or about 60%, greater than or about 65%, greater than or about 70%, greater than or about 75%, greater than or about 80%, or more. This high level of conformality may be beneficial during filling of the features 315 to avoid the closing of the features 315 prior to filling the features 315 with silicon-containing material 320a. Closing off the features 315 prior to filling the features 315 with silicon-containing material 320a may result in seam and/or void formation in the silicon-containing material 320a.

As the features 315 begin to fill with the silicon-containing material 320a, a surface of the silicon-containing material 320a opposite the along the substrate 305, when exposed, or any other incorporated materials, such as the one or more layers of material 310, may be characterized by terminal hydroxyl (—OH) groups. These hydroxyl groups, if left untreated, may result in a less compressive film that may be prone to cracking during subsequent processing, such as an anneal or other rapid thermal processes. The present technology may incorporate one or more treatments, as further described below, to increase the compressive stress of the material and reduce the cracking potential of the material.

During the above deposition, the semiconductor processing chamber, the pedestal, or the substrate 305 may be maintained at a variety of temperatures at which film depositions may be performed. In some embodiments the temperature of the semiconductor processing chamber, the pedestal, or the substrate 305 may be maintained at less than or about 650° C., less than or about 600° C., less than or about 550° C., less than or about 500° C., or less. In embodiments, the temperature of the semiconductor processing chamber, the pedestal, or the substrate 305 may be maintained at greater than or about 300° C., greater than or about 350° C., greater than or about 400° C., greater than or about 450° C., greater than or about 500° C., or more, which may facilitate thermal decomposition of the precursors, allowing the plasma-free deposition to be performed.

Also during the above deposition, the semiconductor processing chamber may be maintained at a variety of pressures at which depositions may be performed. For example, a pressure within the semiconductor processing chamber may be maintained at greater than or about 10 Torr while depositing the silicon-containing materials 320a, and may be maintained at greater than or about 20 Torr, greater than or about 30 Torr, greater than or about 50 Torr, greater than or about 75 Torr, greater than or about 100 Torr, greater than or about 150 Torr, greater than or about 200 Torr, greater than or about 250 Torr, or more. Similarly, the pressure within the semiconductor processing chamber may be maintained at less than or about 350 Torr while depositing the silicon-containing materials 320a, and may be maintained at less than or about 300 Torr, less than or about 250 Torr, less than or about 200 Torr, less than or about 150 Torr, less than or about 100 Torr, less than or about 75 Torr, less than or about 50 Torr, less than or about 30, less than or about 20 Torr, or less.

The silicon-containing material 320a may be deposited with high compressive stress. Unlike low stress materials that may characterized by internal stress levels that are closer to neutral stress (i.e., 0 MPa), high stress materials are characterized by internal stress levels that are significantly greater than 0 MPa (i.e., high positive (tensile) stress) or significantly less than 0 MPa (i.e., high negative (compressive) stress). High positive stress, which may be characterized as tensile stress, may result in the expansion of adjacent material that may create an outward, pushing force on adjacent substrate features. High negative stress, which may be characterized as compressive stress, may result in the contraction of adjacent material that may create an inward, pulling force on adjacent substrate features. In other words, higher-stress materials may be characterized by a stress level with an absolute value that is significantly greater than 0 MPa. Thus, when a material is characterized by a stress level of "greater than −1000 MPa", this refers to the absolute value of the stress level, and includes levels such as −1500 MPa, −2000 MPa, etc. Similarly, when a material is characterized by a stress level of "less than −1000 MPa", this refers stress levels that are closer to neutral stress (i.e., 0 MPa), and includes levels such as −500 MPa, −100 MPa, etc., but does not extend to positive values greater than or about 1000 MPa.

Exemplary stress values of the as-deposited silicon-containing material 320a may include greater than or about −50 MPa or less, where a stress value that is more negative means the material has more stress, and a stress value closer to 0 MPa has less stress. Additional exemplary stress value ranges may include greater than or about −60 MPa, greater than or about −70 MPa, greater than or about −80 MPa, greater than or about −90 MPa, greater than or about −100 MPa, greater than or about −125 MPa, greater than or about −150 MPa, greater than or about −175 MPa, greater than or about −200 MPa, or more. In embodiments, amorphous silicon-containing material may be deposited and subsequently oxidized. The oxidation may result in volumetric expansion of the silicon-containing material 320a material and may result in the silicon-containing material 320a becoming compressive. In conventional silicon-containing material deposition operations where TEOS and $O_3$ are used, no volumetric expansion may occur and the deposited material may be tensile instead of compressive.

At optional operation 215, subsequent to depositing the silicon-containing material 320a, the method 200 may include treating the deposited silicon-containing material 320a. Treating the silicon-containing material 320a during optional operation 215 may include contacting the material with plasma effluents of a treatment precursor. In embodiments, the treatment precursor may also be or include an oxygen-containing precursor. The contacting may reorganize bonding in the silicon-containing material to, for example, break hydroxyl groups and form Si—O—Si bonds. This reorganization of the bonds in the silicon-containing material 320a may further increase the compressive stress of the film.

The treatment precursor provided at optional operation 215 may be any precursor able to convert Si—OH bonds into Si—O—Si bonds. Treatment precursors that may be used in optional operation 215 may be or include any number of inert precursors. For example, the treatment precursor may be or include argon, helium, nitrogen, xenon, diatomic oxygen ($O_2$), ozone ($O_3$), or any other precursor able to reorganize the bonds in the silicon-containing material 320a to increase the compressive stress of the film.

During the treatment, a plasma may be formed of the treatment precursor. Plasma power may impact the depth of precursor penetration, which may impact the increase in compressive stress of the film. Accordingly, in some embodiments the plasma power applied when generating the plasma of the treatment precursor may be greater than or about 100 W, greater than or about 200 W, greater than or about 300 W, greater than or about 400 W, greater than or about 500 W, greater than or about 600 W, greater than or about 700 W, greater than or about 800 W, greater than or about 900 W, greater than or about 1,000 W, greater than or about 1,100 W, greater than or about 1,200 W, greater than or about 1,300 W, greater than or about 1,400 W, greater than or about 1,500 W, or more. However, at higher plasma power the bombardment may increase and may cause sputtering and/or etching of the silicon-containing material 320a, and thus, in some embodiments, the plasma power may be less than or about 1,500 W, less than or about 1,400 W, less than or about 1,300 W, less than or about 1,200 W, less than or about 1,000 W, or less. The plasma may be produced at a frequency of from about 350 KHz to about 100 MHz (e.g., 350 KHz, 2 MHz, 13.56 MHz, 27 MHz, 40 MHz, 60 MHz, or 100 MHz). While forming the plasma of the treatment precursor and treating the silicon-containing material, a temperature within the semiconductor processing chamber may be maintained at the same temperature as the deposition operations, or may be adjusted to be a different temperature within the ranges previously discussed with regard to the deposition operation.

Conversely, the treatment at operation 215 may be performed at a lower pressure than the formation of the silicon-containing material at operation 210. During operation 215, the pressure may be maintained at less than or about 50 Torr while treating the silicon-containing material 320a, and may be maintained at less than or about 40 Torr, less than or about 30 Torr, less than or about 25 Torr, less than or about 20 Torr, less than or about 15 Torr, less than or about 10 Torr, less than or about 5, less than or about 3 Torr, or less, which may facilitate an increased mean free path during the deposition and/or increase the radical energy. An increased mean free path may allow the plasma effluents of the treatment precursor to reach the bottom of the features 315. Additionally, an increased radical energy may increase the interaction between the plasma effluents of the treatment precursor and the silicon-containing material 320a.

Exemplary stress values of the treated silicon-containing material 320a may include greater than or about −100 MPa or less, greater than or about −125 MPa, greater than or about −150 MPa, greater than or about −175 MPa, greater than or about −200 MPa, greater than or about −225 MPa, greater than or about −250 MPa, greater than or about −275 MPa, greater than or about −300 MPa, greater than or about −325 MPa, greater than or about −350 MPa, or more. While not intending to be bound by any particular theory about what causes the treated material to be characterized by increased compressive stress levels, it is believed that the treatment may lead to bombardment of the material which may reorganize Si—OH bonds into Si—O—Si bonds to further densify the film and thereby increase the compressive stress.

Figure 3C:
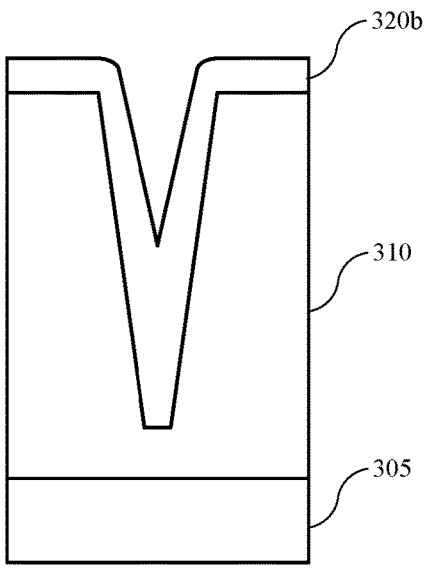
Figure 3D:
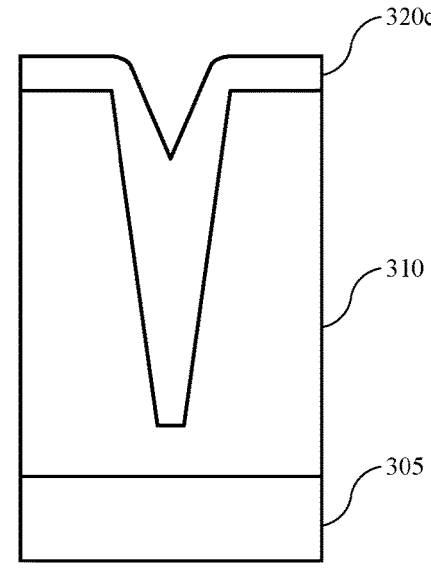

In embodiments, the features 315 may be filled in one deposition of silicon-containing material 320a. However, as illustrated in FIGS. 3C-3D, embodiments of the present technology may include sequentially filling the features 315 with silicon-containing material. For example, an additional silicon-containing material 320b may be deposited, which may be followed by treating the additional silicon-containing material 320b. After treatment, the additional silicon-containing material 320b may be combined and be consistent with the previously deposited and optionally treated silicon-containing material 320a. This process may be repeated for any number of cycles. As shown in FIG. 3D, additional silicon-containing material 320c may be deposited such that the one or more features 315 may iteratively fill higher in a bottom-up gapfill, such as towards the top of the feature 315, during each cycle.

The number of iterations of sequentially depositing film and optionally treating the film may be dependent on a variety of factors including, but not limited to, the depth of the features 315, the aspect ratio of the features 315, and/or amount of silicon-containing material deposited. In some embodiments, the method 200 of depositing the silicon-containing material and optionally treating the silicon-containing material may be repeated at least two times, and may include repeating the operations at least three times, at least four times, at least five times, at least six times, at least seven times, at least ten times, at least fifteen times, or more. During each iteration, a thickness of the as-deposited silicon-containing material may be less than or about 30 Å. At thicknesses greater than 30 Å, the optional treatment at operation 215 may not be able to treat the entire thickness of the silicon-containing material. Accordingly, during each iteration, a thickness of the as-deposited silicon-containing material may be less than or about 28 Å, less than or about 26 Å, less than or about 24 Å, less than or about 22 Å, less than or about 20 Å, or less.

At operation 220, the method 200 may include annealing the substrate 305. Annealing the substrate at operation 220 may include providing a nitrogen-containing precursor or an oxygen-containing precursor to the processing region of the semiconductor processing chamber. In embodiments, the method 200 may include halting a flow of the silicon-containing precursor prior to operation 220. Halting the flow of the silicon-containing precursor may stop deposition, allowing the anneal of the deposited silicon-containing material to be performed. The nitrogen-containing precursor or oxygen-containing precursor may be provided to the same processing region of the semiconductor processing chamber to deposit the silicon-containing material, and may be continued from the deposition(s) operation as noted above. In other embodiments, the structure 300 may be moved to a different chamber prior to operation 220. Nitrogen-containing precursors that may be used in method 200 may be or include any number of nitrogen-containing precursors. For example, the nitrogen-containing precursor may be or include nitrous oxide ($N_2O$), diatomic nitrogen ($N_2$), ammonia ($NH_3$), a combination of one or more of these, or any other nitrogen-containing materials. Oxygen-containing precursors that may be used in method 200 may be or include any number of oxygen-containing precursors. For example, the oxygen-containing precursor may be or include nitrous oxide ($N_2O$), water ($H_2O$), diatomic oxygen ($O_2$), ozone ($O_3$), a combination of one or more of these, or any other oxygen-containing materials.

The annealing at operation 220 may be performed to form memory cells in the structures, which may be a 3D NAND structure. During the anneal, the temperature may be increased compared to temperatures used during the previous deposition and/or treatment operations. A temperature within the semiconductor processing chamber in which the anneal may be performed may be maintained at greater than or about 600° C. while annealing the substrate 305, and may be maintained at greater than or about 650° C., greater than or about 700° C., greater than or about 750° C., greater than or about 800° C., greater than or about 850° C., greater than or about 900° C., or more. However, at greater temperatures, the substrate 305 and/or the one or more layers of material 310 if present, may also be affected by the anneal. For example, in embodiments using an oxygen-containing precursor for operation 220 and a substrate 305 that is or includes silicon, the substrate 305 may begin to oxidize as well. Accordingly, the temperature within the semiconductor processing chamber may be maintained at less than or about 1,000° C. while annealing the silicon-containing material, and may be maintained at less than or about 950° C., less than or about 900° C., less than or about 850° C., or less.

Annealing the silicon-containing material with the nitrogen-containing precursor or oxygen-containing precursor at operation 220 may continue for a sufficient time to form memory cells in the structure. In embodiments, the annealing may be performed for a period of time of greater than or about 15 minutes, and may be greater than or about 30 minutes, greater than or about 45 minutes, greater than or about 60 minutes, or greater. Embodiments of the present technology may result in reduced shrinkage of the silicon-containing material during the anneal. For example, the shrinkage of the silicon-containing material after the anneal may be characterized by less than or about 5%, such as a shrinkage of less than or about 4.5%, less than or about 4%, less than or about 3.5%, less than or about 3%, less than or about 2.5%, less than or about 2%, less than or about 1.5%, less than or about 1%, less than or about 0.5%, less than or about 0.1%, or less.

The present technology may provide a silicon-containing material that may be characterized by a reduced change in stress compared to conventional technology. After the anneal at operation 220, the silicon-containing material may be characterized by a change in stress of less than or about 50 MPa, such as less than or about 40 MPa, than or about 30 MPa, such as less than or about 20 MPa, than or about 10 MPa, such as less than or about 5 MPa, less than or about 1 MPa, or less. Additionally, the present technology may provide a silicon-containing material that may be characterized by a breakdown of greater than or about 5 MV/cm. This breakdown voltage makes the material suitable for many semiconductor applications, not limited to 3D NAND applications. In embodiments, the silicon-containing material that may be characterized by a breakdown of greater than or about 6 MV/cm, such as greater than or about 7 MV/cm, greater than or about 8 MV/cm, greater than or about 9 MV/cm, greater than or about 10 MV/cm, or more.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a silicon-containing precursor" includes a plurality of such precursors, and reference to "the silicon-containing material" includes reference to one or more materials and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing method comprising:
   providing a silicon-containing precursor to a processing region of a semiconductor processing chamber, wherein a substrate defining one or more features is disposed within the semiconductor processing chamber;
   forming a silicon-containing material on the substrate, wherein the silicon-containing material is characterized by a stress of greater than or about-200 MPa; and
   annealing the substrate at a temperature of greater than or about 700° C.

2. The semiconductor processing method of claim 1, wherein the silicon-containing precursor comprises silane ($SiH_4$), disilane ($Si_2H_6$), or trisilane ($Si_3H_8$).

3. The semiconductor processing method of claim 1, wherein a temperature within the semiconductor processing chamber is maintained at less than or about 600° C. while forming the silicon-containing material.

4. The semiconductor processing method of claim 1, wherein a pressure within the semiconductor processing chamber is maintained at less than or about 350 T.

5. The semiconductor processing method of claim 1, further comprising:
   providing an oxygen-containing precursor with the silicon-containing precursor.

6. The semiconductor processing method of claim 1, wherein the semiconductor processing chamber is maintained plasma-free while forming the silicon-containing material.

7. The semiconductor processing method of claim 1, wherein, subsequent to annealing the silicon-containing material, the silicon-containing material is characterized by a shrinkage of less than or about 5%.

8. The semiconductor processing method of claim 1, further comprising:
   subsequent to forming the silicon-containing material, providing an inert precursor to the processing region of the semiconductor processing chamber;
   forming plasma effluents of the inert precursor; and
   contacting the silicon-containing material with the plasma effluents of the inert precursor.

9. The semiconductor processing method of claim 8, wherein the inert precursor comprises argon.

10. The semiconductor processing method of claim 8, further comprising:
   providing an oxygen-containing precursor with the inert precursor.

11. A semiconductor processing method comprising:
   providing a silicon-containing precursor to a processing region of a semiconductor processing chamber, wherein a substrate comprising one or more features is disposed within the semiconductor processing chamber, and wherein the silicon-containing precursor comprises disilane ($Si_2H_6$);

forming a silicon-containing material on the substrate, wherein the silicon-containing material is characterized by a stress of greater than or about −200 MPa; and annealing the substrate at a temperature of greater than or about 700° C., wherein the silicon-containing material is characterized by a shrinkage of less than or about 5%.

12. The semiconductor processing method of claim 11, wherein the silicon-containing material is characterized by a breakdown of greater than or about 5 MV/cm.

13. The semiconductor processing method of claim 11, wherein annealing the substrate comprises contacting the substrate with a nitrogen-containing precursor.

14. The semiconductor processing method of claim 11, further comprising:

performing a plasma treatment with an inert precursor subsequent to forming the silicon-containing material.

15. The semiconductor processing method of claim 14, wherein the plasma treatment is performed at a lower pressure than the forming of the silicon-containing material.

16. The semiconductor processing method of claim 14, wherein the inert precursor comprises argon.

17. A semiconductor processing method comprising:

providing a silicon-containing precursor and an oxygen-containing precursor to a processing region of a semiconductor processing chamber, wherein a substrate defining one or more features is disposed within the semiconductor processing chamber;

forming a silicon-containing material on the substrate, wherein the silicon-containing material is characterized by a stress of greater than or about −200 MPa;

providing an inert precursor to the processing region of the semiconductor processing chamber;

forming plasma effluents of the inert precursor;

contacting the silicon-containing material with the plasma effluents of the inert precursor; and annealing the substrate.

18. The semiconductor processing method of claim 17, wherein the silicon-containing material is characterized by a shrinkage of less than or about 5%.

19. The semiconductor processing method of claim 17, wherein a thickness of the silicon-containing material is less than or about 30 Å.

* * * * *